United States Patent [19]
Leonardi

[11] Patent Number: 6,030,888
[45] Date of Patent: Feb. 29, 2000

[54] METHOD OF FABRICATING HIGH-VOLTAGE JUNCTION-ISOLATED SEMICONDUCTOR DEVICES

[75] Inventor: Salvatore Leonardi, S.M. La Stella-ACI S. Antonio, Italy

[73] Assignee: Consorzio per la Ricerca sulla Microelettronica nel Mezzogiorno, Catania, Italy

[21] Appl. No.: 08/792,483

[22] Filed: Jan. 31, 1997

[30] Foreign Application Priority Data

Jan. 31, 1996 [EP] European Pat. Off. ............. 96830041

[51] Int. Cl.[7] .................................................. H01L 21/04
[52] U.S. Cl. ........................ 438/510; 438/514; 438/526; 438/527
[58] Field of Search ..................................... 438/199, 418, 438/370, 419, 420, 491, 510, 514, 526, 527, 914

[56] References Cited

U.S. PATENT DOCUMENTS

| | | | |
|---|---|---|---|
| 4,311,532 | 1/1982 | Taylor | 148/1.5 |
| 5,156,989 | 10/1992 | Williams et al. | 438/206 |

FOREIGN PATENT DOCUMENTS

| | | | |
|---|---|---|---|
| 0 262 723 | 4/1988 | European Pat. Off. | H01L 21/72 |
| 0 439 899 | 8/1991 | European Pat. Off. | H01L 29/73 |
| 30 16 238 | 10/1981 | Germany | H01L 21/76 |
| 2 089 567 | 6/1982 | United Kingdom | H01L 21/225 |

*Primary Examiner*—Richard Booth
*Assistant Examiner*—Christopher Lattin
*Attorney, Agent, or Firm*—David V. Carlson; Kimton N. Eng; Seed and Berry LLP

[57] ABSTRACT

A method of fabricating a junction-isolated semiconductor device is provided which includes the following steps. Within a first P-type buried region second N-type buried regions are formed. Over the first and second buried regions, an N-type epitaxial layer defining a surface of the device is grown. In the epitaxial layer, P-type isolation regions extending from the surface down to and in electric continuity with the first buried region and defining, with the first buried region, N-type wells incorporating the second buried regions is formed. And, P-type annular border regions in the epitaxial layer and to the side of the isolation regions are formed. The steps of forming isolation regions and annular border regions semiconducting regions being performed in a single step of selectively introducing doping ions.

27 Claims, 6 Drawing Sheets

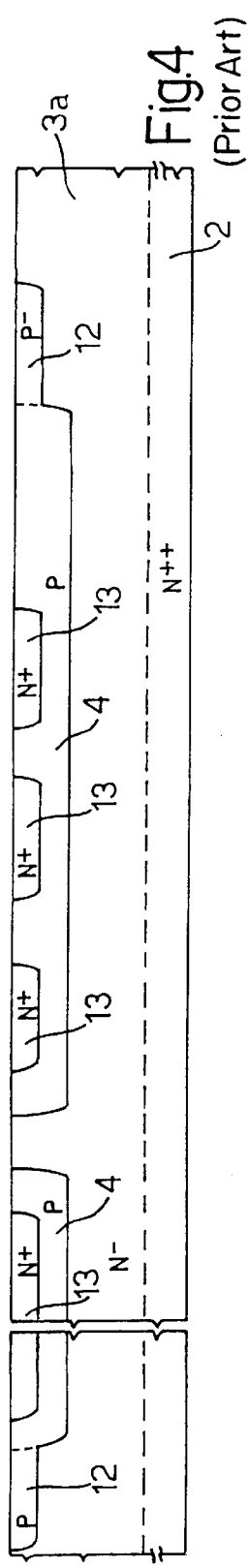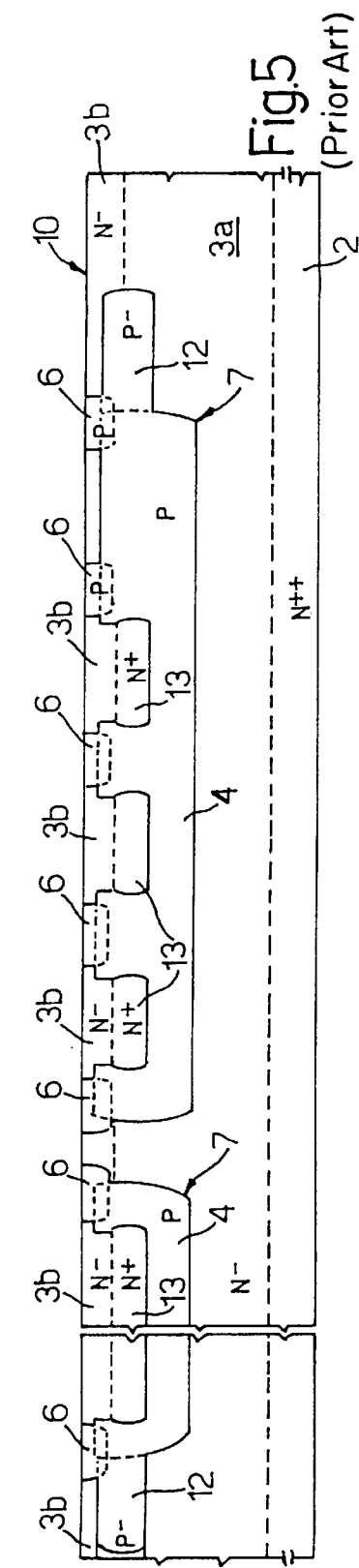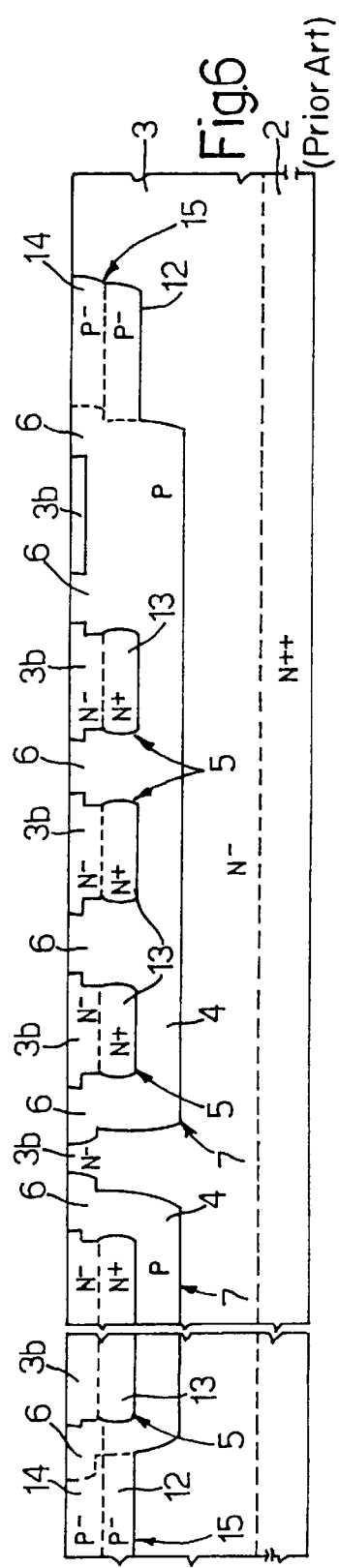

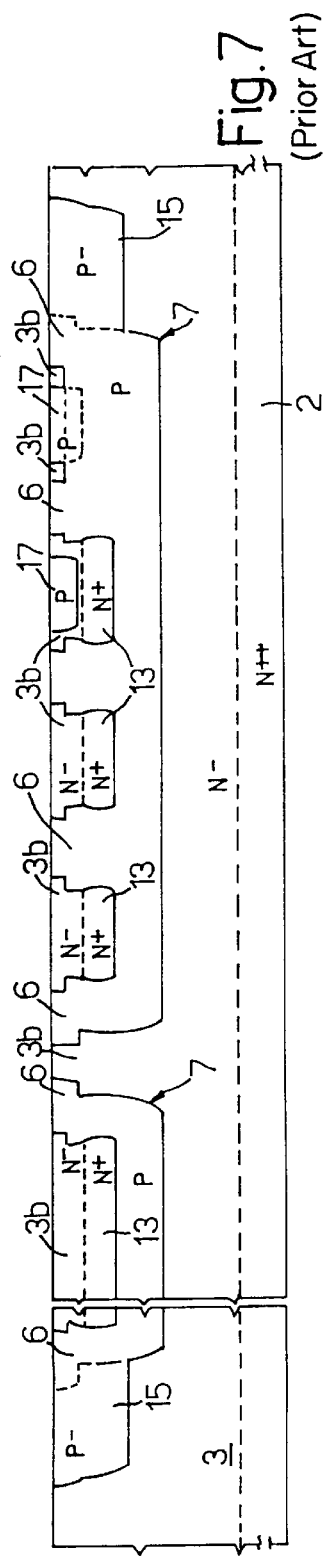
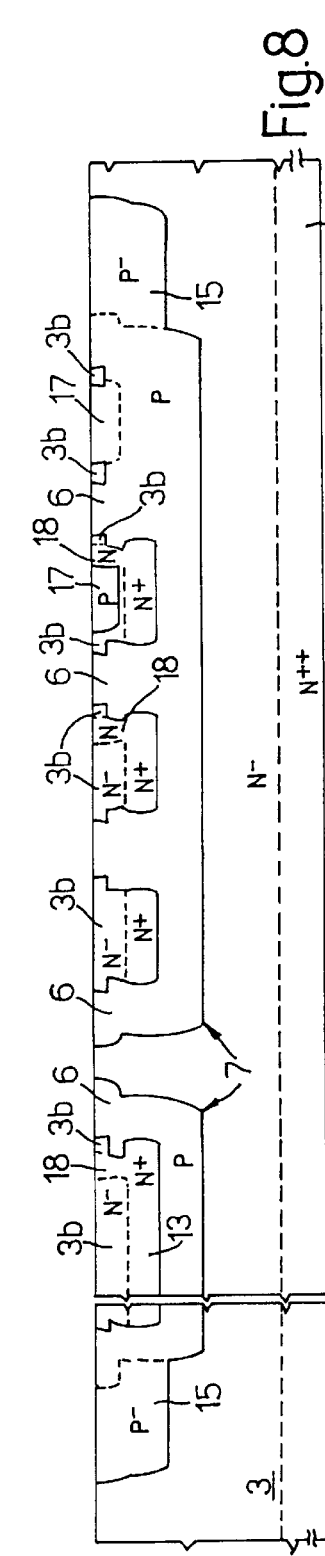
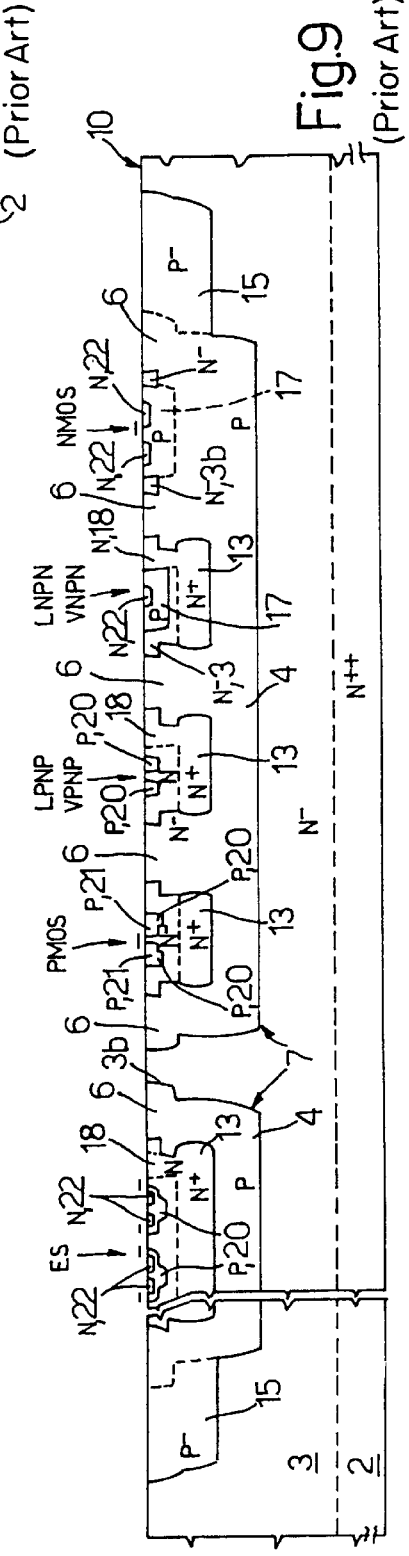
Fig.7 (Prior Art)
Fig.8 (Prior Art)
Fig.9 (Prior Art)

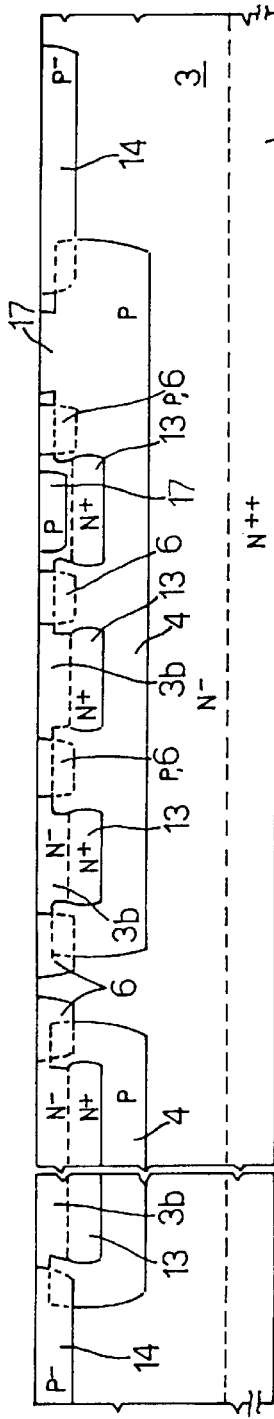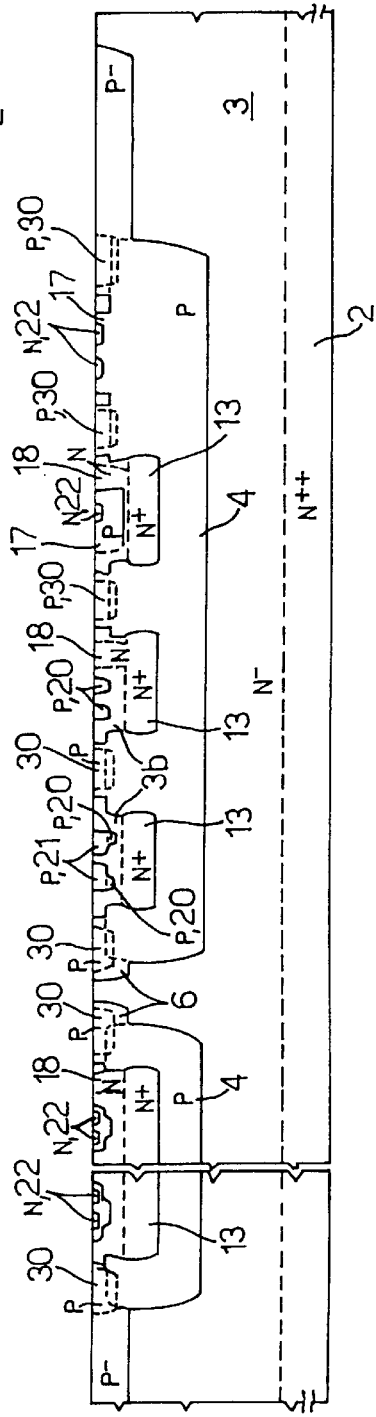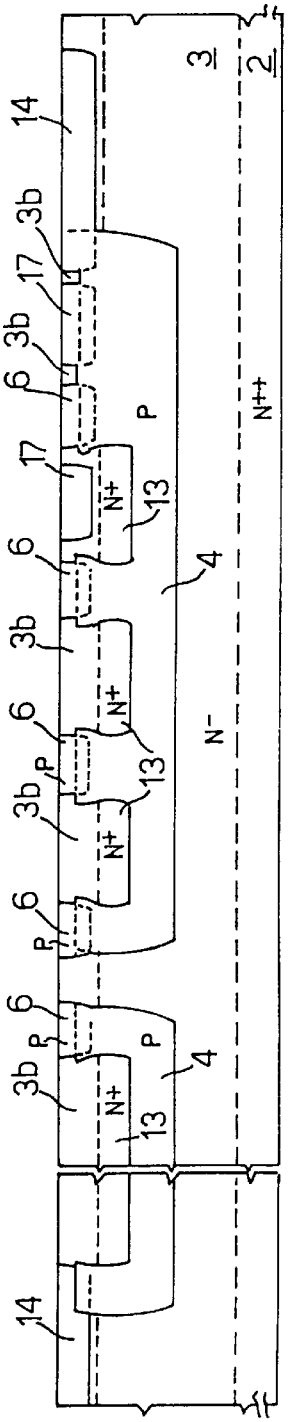

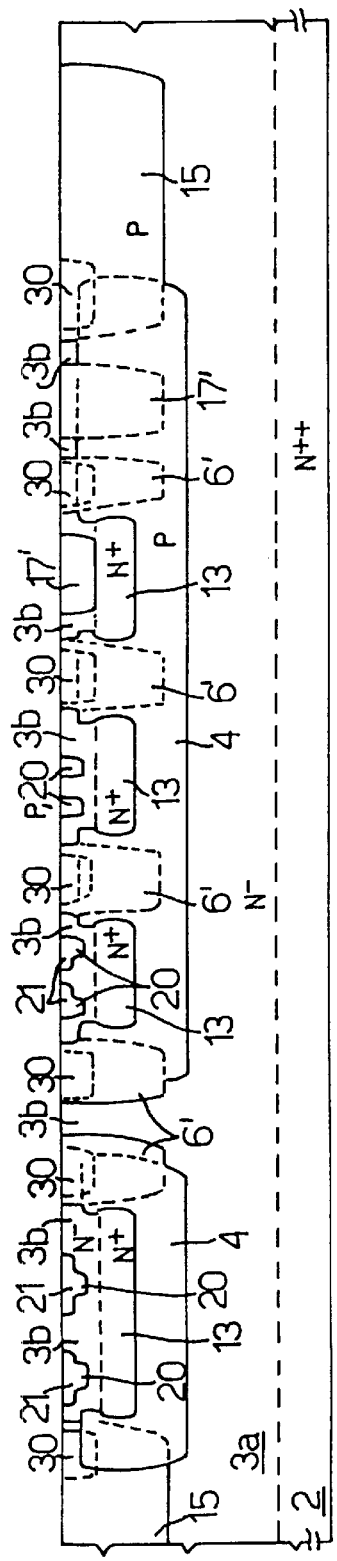

METHOD OF FABRICATING HIGH-VOLTAGE JUNCTION-ISOLATED SEMICONDUCTOR DEVICES

TECHNICAL FIELD

The present invention relates to a method of fabricating high voltage junction-isolated semiconductor devices.

BACKGROUND OF THE INVENTION

As is known, in VIPower (Vertical Intelligent Power) structures, i.e., power structures with vertical-current-flow control circuitry, the drive circuitry components are isolated using the junction isolation technique. FIG. 1 shows a cross section of a portion of a semiconductor material wafer 1 implementing a VIPower structure, and comprising an $N^{++}$ type substrate 2, an $N^-$ type epitaxial layer 3, P-type buried layers 4, N-type dedicated wells 5, and P-type isolation regions 6. The P-type isolation regions 6 separate the N-type dedicated wells 5 and connect electrically to the buried layers 4 to form isolation wells 7. The N-type dedicated wells 5 house components of various types. For example, region LV to the right in FIG. 1 houses low-voltage MOS and/or bipolar components, and region HV to the left houses high-voltage power components.

As can be seen, as of surface 10 of the wafer, isolation wells 7 present an opposite type of conductivity to that of N-type dedicated wells 5, with which they define junctions which are reverse-biased to electrically isolate the various components and the power stage.

At present, the FIG. 1 structure is fabricated using the method described below with reference to FIGS. 2–9, wherein the regions common to FIG. 1 are indicated using the same numbering system. Additionally, for the sake of simplicity, the borders of superimposed layer portions of the same conductivity type and comparable doping level are only indicated, by dotted lines, in FIG. 1 relative to the step in which the region resulting in said superimposed layers is formed.

Commencing with substrate 2, a first $N^-$ type epitaxial layer 3a is grown. A P-type doping species is implanted and diffused to form buried layers 4 of the isolation wells and obtain the structure shown in FIG. 2. At this point, in the case of high or very high voltage structures in which high border efficiency is desired, a P-type doping species is implanted and diffused to form a $P^-$ type buried border ring 12 (FIG. 3) surrounding the high- and low-voltage regions close to the periphery of the device.

FIG. 4 illustrates an N-type doping species is implanted and diffused inside buried layers 4 to form buried regions 13 forming the bottom portion of N-type dedicated wells 5. A second epitaxial layer 3b is grown and a P-type doping species is implanted and diffused inside second epitaxial layer 3b, in such a position as to ensure electric continuity with buried layers 4, to form isolation regions 6 (FIG. 5). As shown in FIG. 5, the portions of second epitaxial layer 3b over buried regions 13 and laterally delimited by isolation regions 6 combine with buried regions 13 to form N-type dedicated wells 5 (FIG. 6).

At this point, border regions 14 are formed by implanting a small dose of a P-type doping species, which is diffused simultaneously with isolation regions 6. Border regions 14 surround the high-voltage and low-voltage regions, and, if buried rings 12 are provided, are superimposed on rings 12 to form a single deep high-resistivity structure 15 (FIG. 6). To improve the efficiency of structure 15, regions 14 are implanted using a doping species with a high coefficient of diffusion, such as aluminium. To obtain elaborate structures of variable resistivity, the VLD (Variation Lateral Doping) technique may also be used by appropriately designing the layout of the masks for forming regions 12 and 14.

FIG. 7 shows P-type dedicated wells 17 are formed by dedicated implantation and diffusion inside N-wells 5 to form components such as NPN or NMOS transistors. This step, instead of being performed after forming border structure 14 and isolation regions 6, may be performed straight after growing second epitaxial layer 3b.

Referring to FIG. 8, an N-type doping species is implanted or deposited and diffused inside N-wells 5 to form sinkers 18 for connecting buried regions 13.

The active areas of the components to be formed inside respective N-wells 5 and P-wells 17 are then defined (in a manner not shown). Deep body regions 20 and body regions 21 are implanted and diffused in dedicated manner inside N-wells 5 to form components such as NMOS, PMOS, NPN and PNP transistors. Finally, N-type regions 22 are formed by dedicated implantation and diffusion to complete the regions characterizing the MOS and bipolar components and the diffused regions of the power section, and so obtain the structure shown in FIG. 9. The power section (to the left) of the FIG. 9 structure presents an emitter switching ES type structure, comprising a high-voltage MOSFET and a bipolar component. The low-voltage section presents, from left to right, a PMOS transistor, a vertical or lateral PNP transistor, a lateral or vertical NPN transistor, and an NMOS transistor. Fabrication of the device is concluded with the formation of regions (such as gate regions, shown by the dashes in FIG. 9) on surface 10, definition of the contact areas and the relative metalization step.

At least as regards the bulk regions, the above sequence of steps for high-voltage devices is similar to the sequence for integrating low-voltage devices. Consequently, $N^{++}$ type substrate 2 is not required for maintaining the voltage of the components defining the power stage, fabrication commences with a P-type substrate, and high-resistivity border structures 15 contiguous to the outermost isolation region 6 may be dispensed with.

The above method involves a large number of masking and implant steps, which, in addition to increasing fabrication cost, also endanger the efficiency and reliability of the device in the event of misalignment of the masks.

SUMMARY OF THE INVENTION

It is an object of the present invention to provide a fabrication method designed to reduce fabrication cost, and which provides for fewer rejects and greater reliability of the device.

According to the present invention, there is provided a method of fabricating high-voltage junction-isolation semiconductor devices. At least a first buried region of a first connectivity type is formed in a substrate. Second buried regions of a second connectivity type are formed in the first buried region. Next, an epitaxial layer of the second connectivity type is grown over the first and second buried regions. The epitaxial layer defines a surface layer of the device for forming isolation regions of the first connectivity type in the epitaxial layer. Isolation regions extend from the first surface down to and in electric continuity with the first buried region and define, with the first buried region, wells of the second conductivity type and incorporate the second buried regions. Semiconducting regions of the first connectivity type are formed in the epitaxial layer and to the side of the isolation regions. A single step of selectively introducing doping ions is used to form the isolation and semiconducting regions.

In practice, the isolation region is formed, not by dedicated implantation as in the known method, but using the regions forming the device border structure, and, in case, other P-type regions forming part of the components integrated to form the low-voltage and/or high-voltage circuitry.

BRIEF DESCRIPTION OF THE DRAWINGS

A number of preferred, non-limiting embodiments of the present invention will be described by way of example with reference to the accompanying drawings.

FIGS. 2–9 show cross sections of a semiconductor material wafer at various fabrication steps according to a known method of FIG. 1.

FIGS. 10–14 show cross sections of various fabrication steps according to a first embodiment of the present invention.

FIG. 15 shows a cross section of a fabrication step according to a second embodiment of the present invention.

FIG. 16 shows a cross section of a third embodiment of the present invention.

DETAILED DESCRIPTION OF THE INVENTION

According to a first embodiment of the present invention, illustrated in FIGS. 10–14, the isolation structure (regions 6, FIG. 5) is formed simultaneously with the border structure (regions 14, FIG. 6). This embodiment will now be described, in which the layers and regions common to the known solution in FIGS. 1–9 are indicated using the same numbering system.

Figure 1:
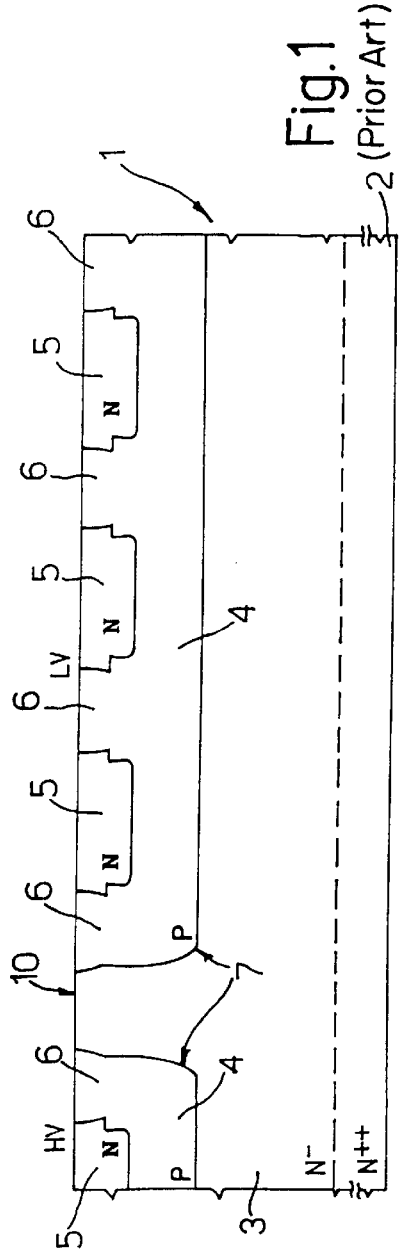
FIG. 1 shows a cross section of the basic structure of a known junction-isolated integrated device.
Figure 2:
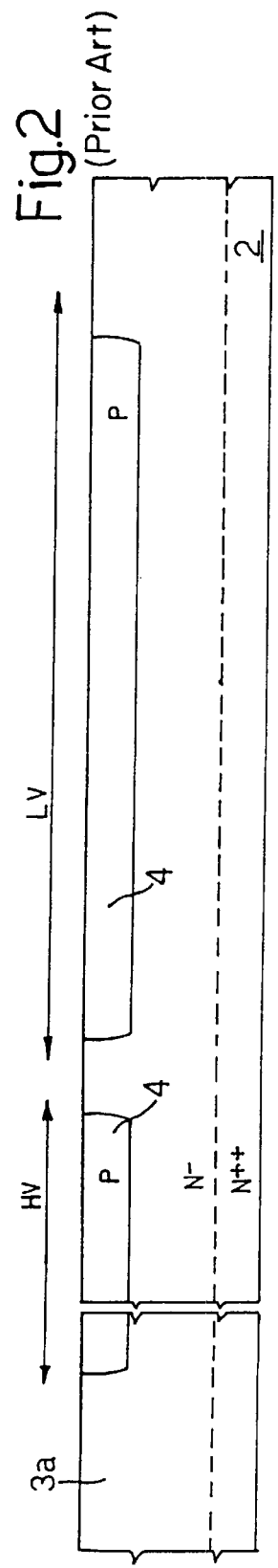
Figure 3:
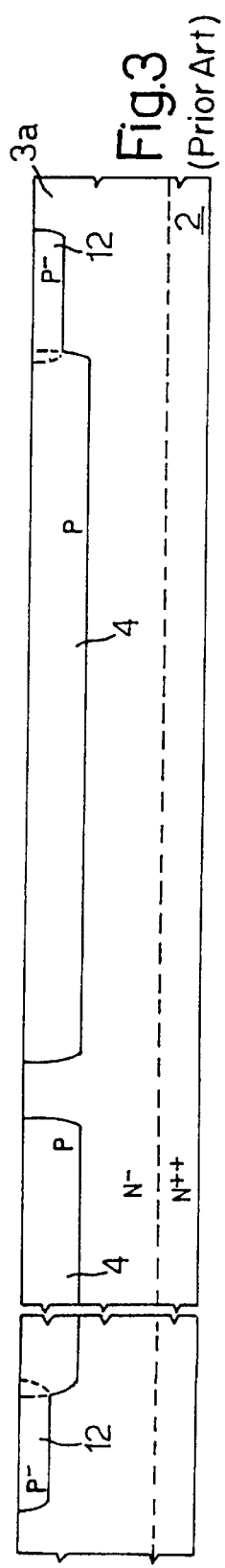
Figure 10:
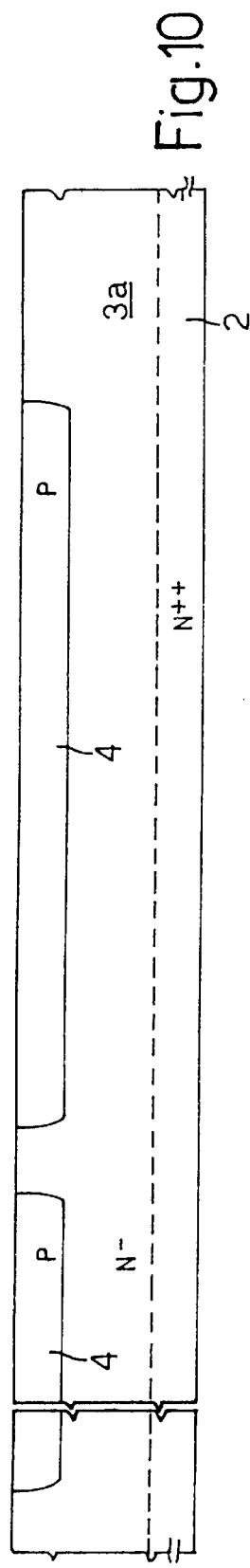
Figure 11:
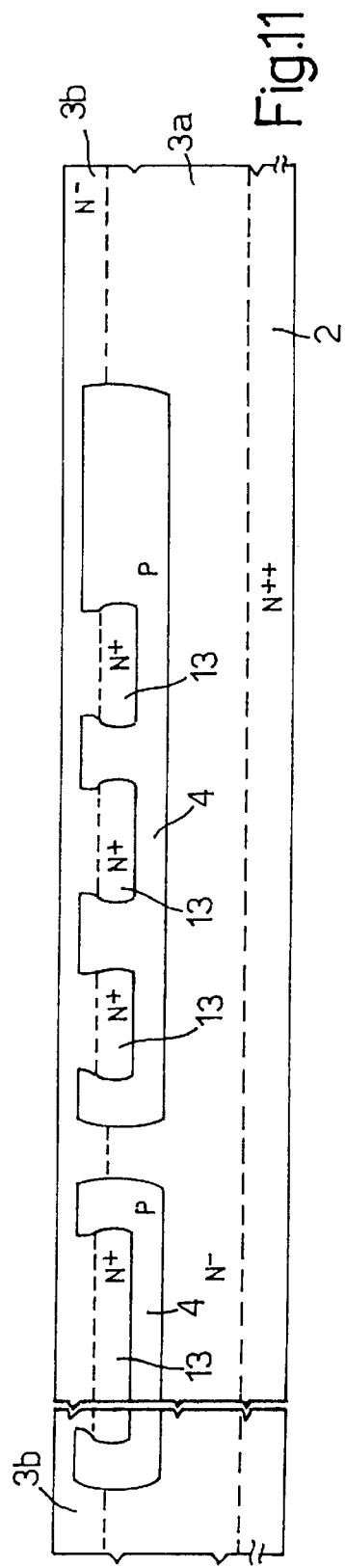

As shown in FIG. 10, and as in the known method, a first N⁻ type epitaxial layer 3a is grown on an N⁺⁺ type semiconductor material substrate 2 and isolation wells 4 are formed in the grown epitaxial layer 3a. A P-type doping species (e.g., boron) is implanted and diffused to form the P-type buried border ring 12 surrounding the high- and low-voltage regions close to the periphery of the chip. This implant dose is preferably in the range of approximately $10^{12}$ atoms/cm². Referring to FIG. 11, an N-type doping species is implanted and diffused to form buried regions 13 and a second epitaxial layer 3b is grown over the whole wafer.

Figure 12:
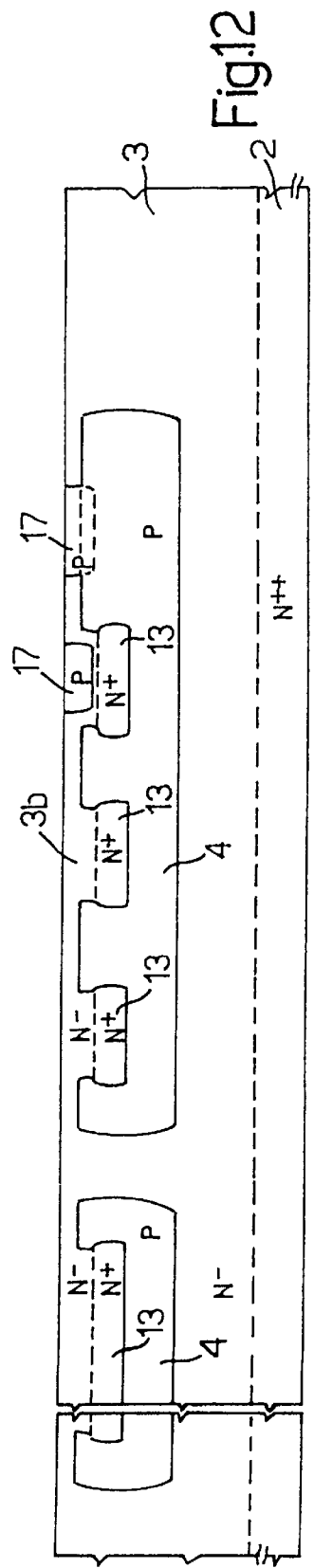

Referring to FIG. 12, as in the known method, a P-type doping species (e.g., boron) is implanted and diffused in the epitaxial layer to form P-type dedicated wells 17 in which to form the NPN or NMOS transistors.

Referring to FIG. 13, at this point, a small dose of a P-type doping species (e.g., boron) is implanted and diffused in a dedicated manner to simultaneously form isolation regions 6 and border region 14 (FIG. 13). Analogously to the prior art method, upper border regions 14 are superimposed on lower border ring regions 12 and form a single deep high-resistivity structure 15. The inner annular region of border region 14 and isolation regions 6 extend down to buried layers 4 to ensure electric continuity between regions 6, 14 and buried layers 4. In fact, electric continuity between regions 6 and 14, on the one hand, and buried layers 4, on the other, is ensured by the fact that the thermal cycle for diffusing the border region 14 provides for a sufficiently deep junction to ensure a good degree of border efficiency.

Moreover, the outer portion of buried layer 4, on either side of buried regions 13, extends upwards towards surface 10 to ensure buried layers 4 and regions 6, 14 are superimposed.

Alternatively, regions 6 and 14 are formed, as previously stated, in a single implant and diffusion step, but before forming P-type dedicated wells 17.

As of this point, fabrication continues in a known manner with the formation of N-type sinkers 18 for connecting on to buried regions 13, definition of the active areas of the components. Additionally, deep body regions 20, body regions 21 and N-type regions 22 are formed for characterizing the components.

To reduce the resistivity of isolation region 6 close to the surface 10, region 6 is enriched with P-type doping species to minimize contact resistance and improve the isolation structure as a whole. This may be done using any of the P-type doping implants already employed in the fabrication method to define the active regions of the components, such as the deep body regions and body regions of NMOS or DMOS transistors, the base regions of NPN transistors, the source and drain regions of PMOS transistors, or the emitter regions of PNP transistors. In other words, in the same implant and diffusion step, it is possible to simultaneously form enriching regions 30 and base regions 17, or enriching regions 30 and deep body regions 20, or enriching regions 30 and body, emitter, source and drain regions 21 (FIG. 14).

As an alternative embodiment, FIGS. 10–14 illustrate that lower P-type buried rings may be omitted. As in the known method, P⁻ type buried rings may be implanted to form the bottom portion of border structure 15 prior to growing second epitaxial layer 3b (FIGS. 10 and 11).

The above method therefore provides for eliminating one masking step.

A second embodiment provides for even further reducing the fabrication sequence.

As shown in FIG. 15, after growing second epitaxial layer 3b, a P-type doping species is implanted and diffused to simultaneously form P-type dedicated wells 17, border region 14 (forming, with bottom border ring 12, structure 15) and isolation regions 6. P-type dedicated wells 17 eventually form the base regions of NMOS and NPN transistors. Since the dose implanted to form P-type dedicated wells 17 is normally in the order of $10^{12}$–$10^{13}$ a/cm², whereas border region 14 is preferably a dose in the order of $10^{12}$ a/cm², both regions may therefore normally be implanted with a dose of $10^{12}$ a/cm². Should fabrication require a dose of $10^{13}$ a/cm² for wells 17, border region 14 may be formed using the known variation lateral doping technique. This technique, which, as is well known in the art provides for forming implanted regions with an effective dose almost one order of magnitude smaller than the actual dose used.

The structure is then completed as in the first embodiment, with the formation of N-type regions 18, 22 and P-type regions 20, 21. When forming P-type regions 20, 21, it is also possible to further enrich the surface portion of isolation regions 6 to reduce their surface resistance, as described previously.

To form the bottom portion of the border structure (region 12 of FIGS. 3–6), the implant step of regions 6, 14, 17 may be exploited, instead of carrying out a dedicated implant prior to growing the second epitaxial layer. In particular and referring to FIG. 16, according to a third embodiment, a fast-diffuse doping species such as aluminium is used as the P-type doping agent, so that one implant and diffusion step provides for forming regions 6', 15 and 17' with no buried-ring structures being required. In this case also, the surface resistance of isolation regions 6 may be reduced by implanting enriching regions 30 simultaneously with deep body regions 20 or body regions 21.

The advantages of the method according to the present invention will be clear from the foregoing description. In particular, it provides for reducing the known method by one or even two fabrication masks, thus reducing fabrication cost and the problems posed by possible misalignment of the implant masks.

The solution according to the invention is even more advantageous in the case of buried-ring border structures (see, for example, European Patent Application n.93830286.6), or when the devices are isolated in dedicated manner by a double implant and diffusion of a doping species on the first and second epitaxial layer respectively (see, for example, EP-A-O 093 304).

The isolation structure formed according to the present invention tends to be more advantageous in integrated structures featuring a very thin an increasingly thinner second epitaxial layer (3b), in which case, the buried isolation region 4 and surface regions 6 are better connected, thus further reducing the resistance of the isolation structure as a whole.

Clearly, changes may be made to the method as described and illustrated herein without, however, departing from the spirit and scope of the present invention.

I claim:

1. A method of fabricating a high voltage semiconductor device, comprising the steps of:

forming at least a first buried region of a first conductivity type in a substrate;

forming second buried regions of a second conductivity type in said first buried region;

growing an epitaxial layer of said second conductivity type over said first and second buried regions, said epitaxial layer defining a surface of said device;

forming isolation regions of said first conductivity type in said epitaxial layer, said isolation regions extending from said surface down to and in electric continuity with said first buried region and defining, with said first buried region, wells of said second conductivity type and incorporating said second buried regions;

forming annular border regions of said first conductivity type in said epitaxial layer, laterally surrounding said first buried region; and forming semiconducting regions of said first conductivity type in said epitaxial layer and to the side of said isolation regions, wherein said steps of forming isolation regions and forming annular border regions comprise a single step of selectively introducing doping ions into the epitaxial layer.

2. The method as claimed in claim 1, further including the step of selectively introducing a doping species of said first conductivity type into said isolation regions and into said wells of said second conductivity type, for simultaneously forming enriching regions and conducting regions.

3. The method as claimed in claim 2 wherein said conducting regions are selected from deep body regions, body regions, base regions, source and drain regions, and emitter regions.

4. The method claim 1, wherein said semiconducting regions further include dedicated wells defining base regions of bipolar transistors or body regions of MOS transistors and in that said steps of forming isolation regions and forming annular border regions are performed simultaneously with a step of forming said dedicated wells through said single step of selectively introducing doping ions.

5. The method as claimed in claim 1 wherein said semiconducting regions further include dedicated wells defining base regions of bipolar transistors or body regions of MOS transistors.

6. The method as claimed in claim 1 wherein said semiconducting regions further include border regions laterally surrounding said first buried region and dedicated wells defining base regions of bipolar transistors or body regions of MOS transistors.

7. The method as claimed in claim 6 wherein said step of selectively introducing doping ions is performed with a dose of about $10^{12}$–$10^{13}$ a/cm$^2$, using an effective doping level reducing technique.

8. The method as claimed in claim 1 wherein said doping ions further include high-diffusion doping species, and said selective insertion step further includes the step of forming deep border regions.

9. The method as claimed in claim 8 wherein said doping ions comprise aluminium.

10. A method of fabricating a high voltage semiconductor device, comprising the steps of:

forming at least a first buried region of a first conductivity type in a substrate;

growing a first epitaxial region of said second conductivity type;

introducing, in said first epitaxial region, conductivity determining second agents to form a bottom ring region of said first conductivity type;

forming second buried regions of a second conductivity type in said first buried region;

growing an epitaxial layer of said second conductivity type over said first and second buried regions, said epitaxial layer defining a surface of said device;

forming isolation regions of said first conductivity type in said epitaxial layer, said isolation regions extending from said surface down to and in electric continuity with said first buried region and defining, with said first buried region, wells of said second conductivity type and incorporating said second buried regions;

forming annular border regions of said first conductivity type in said epitaxial layer, laterally surrounding said first buried region; and forming semiconducting regions of said first conductivity type in said epitaxial layer and to the side of said isolation regions, wherein said steps of forming isolation regions and forming annular border regions comprise a single step of selectively introducing doping ions, and wherein said step of forming second buried regions comprises introducing, in said first buried region, conductivity determining third agents;

said step of growing an epitaxial layer comprises the step of growing a second epitaxial region on said first epitaxial region, with said conductivity determining first, second and third agents diffusing in said second epitaxial region; and said step of forming annular border regions comprises introducing conductivity determining fourth agents in said second epitaxial region over said bottom ring region and diffusing said conductivity determining fourth agents down to said bottom ring region to form a high-resistivity high-voltage isolation ring structure.

11. The method as claimed in claim 1 wherein said first conductivity type is a P type, and said second conductivity type is an N type.

12. The method as claimed in claim 1 wherein said first buried region comprises a buried isolation region formed in an epitaxial region of said second conductivity type.

13. A method of fabricating an integrated circuit, comprising the steps of:
growing a first epitaxial layer of a first conductivity type on a substrate of said first conductivity type;
forming a buried well of a second conductivity type in said first epitaxial layer;
forming buried active regions of said first conductivity type surrounded by said buried well;
growing a second epitaxial layer of said first conductivity type over said first epitaxial layer, said second epitaxial layer defining a surface of said integrated circuit; and
simultaneously forming isolation and border regions of said second conductivity type in said second epitaxial layer by implanting impurities of said second conductivity type into said second epitaxial layer, wherein
said isolation regions extend from said surface and electrically contact said buried well, said isolation regions and said buried well together defining deep wells of said second conductivity type surrounding said buried regions.

14. The method of claim 13, further including the step of implanting a dopant ion of said second conductivity type into said isolation regions.

15. The method of claim 13 wherein said step of simutaneously forming isolation and border regions further included the step of forming device regions.

16. The method of claim 15 wherein said step of forming device regions further includes the step of forming deep body, body, base, source, drain, and emitter regions to form the devices of said intergrated circuit.

17. The method of claim 16 wherein said device includes bipolar and MOS transistors.

18. The method of claim 13 wherein said step of forming isolation regions further includes the steps of implanting dopant ions of said second conductivity type into said second epitaxial layer and diffusing the resultant structure to increase the depth of the isolation region and decrease the distance between the surface and said buried well to insure electric continuity within said dormed deep wells.

19. The method of claim 13 wherein at least one said border regions contacts at least one of said isolation regions at the periphery of said intergrated circuit.

20. The method of claim 14 wherein said step of forming enhanced isolation regions forms deep border and deep isolation regions.

21. The method of claim 20 wherein said dopant ion used to form said deep border and deep isolation regions is aluminium.

22. A method of fabricating an intergrated circuit, comprising the steps of:
growing a first epitaxial layer of a first conductivity type on a substrate of said first conductivity type;
forming a buried well of a second conductivity type in said first epitaxial layer;
forming buried active regions of said first conductivity type surrounded by said buried well;
growing a second epitaxial layer of said first conductivity type over said first epitaxial layer, said second epitaxial layer defining a surfaceof said intergrated circuit;
implanting first dopant ions of said second conductivity type into the resultant structure to simultsneously form isolation and first regions, said isolation regions extending from said surface to a depth establishing electric continuity with said buried well and defining, with said buried well, deep wells of said second conductivity type surrounding said buried regions; and
implanting second dopant ions of said second conductivity type into said isolation regions to minimize contact resistance clse to the surface.

23. The process of claim 22 wherein said first regions are border regions contacting at least one of said isolation regions defining the outer periphery of said intergrated circuit.

24. The process of claim 22 wherein said first regions are device regions formed to make operative bipolar and MOS transistors in the intergrated circuit.

25. The process of claim 22 wherein said first regions are border and device regions, said border regions contact at least one of said isolation regions defining the outer periphery of said intergrated circuit, and said device regions define the operative structures of bipolar and MOS transistors in the intergrated circuit.

26. The method of claim 22 wherein said step of implanting second dopant ions further includes simultaneously forming device regions to make operative bipolar and MOS transistors of the intergrated circuit.

27. The method of claim 22 wherein said second dopant ion is aluminum.

* * * * *

UNITED STATES PATENT AND TRADEMARK OFFICE
CERTIFICATE OF CORRECTION

PATENT NO. : 6,030,888
DATED : Feb. 29, 2000
INVENTOR(S) : Salvatore Leonardi

It is certified that error appears in the above-identified patent and that said Letters Patent is hereby corrected as shown below:

Claim 15, column 7, line 31, "simutaneously forming" should read --simultaneously forming--.

Claim 15, column 7, line 32, "further included the" should read --further includes the--.

Claim 18, column 7, line 46, "said dormed deep" should read --said formed deep--.

Claim 22, column 8, line 18, "a surfaceof said" should read --a surface of said--.

Claim 22, column 8, line 28, "resistance clse to" should read --resistance close to--.

Signed and Sealed this

Eighth Day of May, 2001

Attest:

NICHOLAS P. GODICI

Attesting Officer

Acting Director of the United States Patent and Trademark Office